(12) United States Patent     (10) Patent No.: US 12,456,786 B2
Waterman et al.     (45) Date of Patent: Oct. 28, 2025

(54) SPHERICAL DIELECTRIC STRUCTURES FOR STORING ELECTROMAGNETIC ENERGY

(71) Applicants: Timothy G. Waterman, Eldersburg, MD (US); Patrick J. Knowles, Crownsville, MD (US); Urs Werner Batzel, Pittsburgh, PA (US)

(72) Inventors: Timothy G. Waterman, Eldersburg, MD (US); Patrick J. Knowles, Crownsville, MD (US); Urs Werner Batzel, Pittsburgh, PA (US)

( * ) Notice: Subject to any disclaimer, the term of this patent is extended or adjusted under 35 U.S.C. 154(b) by 343 days.

(21) Appl. No.: 17/936,877

(22) Filed: Sep. 30, 2022

(65) Prior Publication Data

US 2024/0120628 A1     Apr. 11, 2024

(51) Int. Cl.
| | |
|---|---|
| *H01P 7/10* | (2006.01) |
| *H01P 1/18* | (2006.01) |
| *H01P 1/195* | (2006.01) |
| *H03H 9/24* | (2006.01) |
| *H05K 9/00* | (2006.01) |

(52) U.S. Cl.
CPC ............... *H01P 1/18* (2013.01); *H01P 1/195* (2013.01); *H01P 7/10* (2013.01); *H03H 9/2431* (2013.01); *H05K 9/0081* (2013.01)

(58) Field of Classification Search
CPC .. H01P 1/005; H01P 1/127; H01P 1/18; H01P 1/184; H01P 1/185; H01P 1/195; H01P 1/203; H01P 1/20309; H01P 1/20381; H01P 1/227; H01P 3/08; H01P 3/081; H01P 3/082; H01P 7/08; H01P 7/082; H01P 7/084; H01P 7/088; H01P 7/10; H01P 9/00; H03H 9/2431; H05K 9/0081
See application file for complete search history.

(56) References Cited

U.S. PATENT DOCUMENTS

| | | | | |
|---|---|---|---|---|
| 3,812,438 | A * | 5/1974 | Hopfer | H03H 7/25 333/246 |
| 4,298,873 | A * | 11/1981 | Roberts | H01Q 3/2617 342/375 |
| 4,338,582 | A * | 7/1982 | Presser | H03H 11/52 330/61 A |
| 2009/0067773 | A1 * | 3/2009 | Krug | G02F 1/065 385/9 |
| 2021/0408655 | A1 * | 12/2021 | Prabhu Gaunkar | H01P 5/028 |

* cited by examiner

*Primary Examiner* — Levi Gannon
(74) *Attorney, Agent, or Firm* — Vorys, Sater, Seymour and Pease LLP; Khaled Shami

(57) ABSTRACT

In one embodiment, an electromagnetic (EM) energy containment device includes a spherically symmetric resonant dielectric structure having a radial dimension $R_0$ defined as $R_0 = 3/\pi \cdot \lambda_0/2$ and having first and second regions with different indices of refraction. The spherically symmetric resonant dielectric structure is configured to receive and to contain, for a selectable duration of time, an electromagnetic wave of a wavelength $\lambda_0$, and can find applications in delay circuits for beam steering for example.

7 Claims, 10 Drawing Sheets

At T1, RF in, Diode ON
At T2, Diode OFF, Energy stored
At T3, RF out, Diode ON

SPHERICAL DIELECTRIC STRUCTURES FOR STORING ELECTROMAGNETIC ENERGY

TECHNICAL FIELD

The present disclosure relates generally to systems and methods for electromagnetic wave storage.

BACKGROUND

Small dielectric spheres "quantum dots" have been used to store electromagnetic energy but only become useful when cooled to near absolute zero. Variable index of refraction fiber optics can carry electromagnetic waves for long distances using total internal reflection, and various optic devices including periscopes, prisms, reflectors, single-lens reflex cameras and binoculars use the principle of total internal reflection. It is also well known that hollow metal spheres are capable of storing electromagnetic energy at certain resonant frequencies related to their size.

Overview

Described herein is an electromagnetic (EM) energy containment device including a structure approximating a spherically symmetric dielectric, having a radial dimension $R_0$ defined as $R_0 = 3/\pi \cdot \lambda_0/2$, and having first and second regions with different indices of refraction. The structure approximating a spherically symmetric dielectric is configured to receive and to contain, for a selectable duration of time, an electromagnetic wave of a wavelength $\lambda_0$, and can find applications in energy storage for example.

Also described herein is a parallel plate delay device for containing EM energy of wavelength $\lambda_0$ for a selectable duration based on similar principles as those of the structure approximating a spherically symmetric dielectric in accordance with certain embodiments. The device includes first and second ground planes, and a dielectric core material disposed between the first and second ground planes, the dielectric core material having an annular shape with an inner diameter $$R_{min} = \frac{3\lambda_0}{8\pi}$$

and an outer diameter $$R_{outer} = \frac{3\lambda_0}{4\pi},$$

and having a tapered effective dielectric cross-section. It can find applications in delay circuits for beam steering for example.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Figure 1:
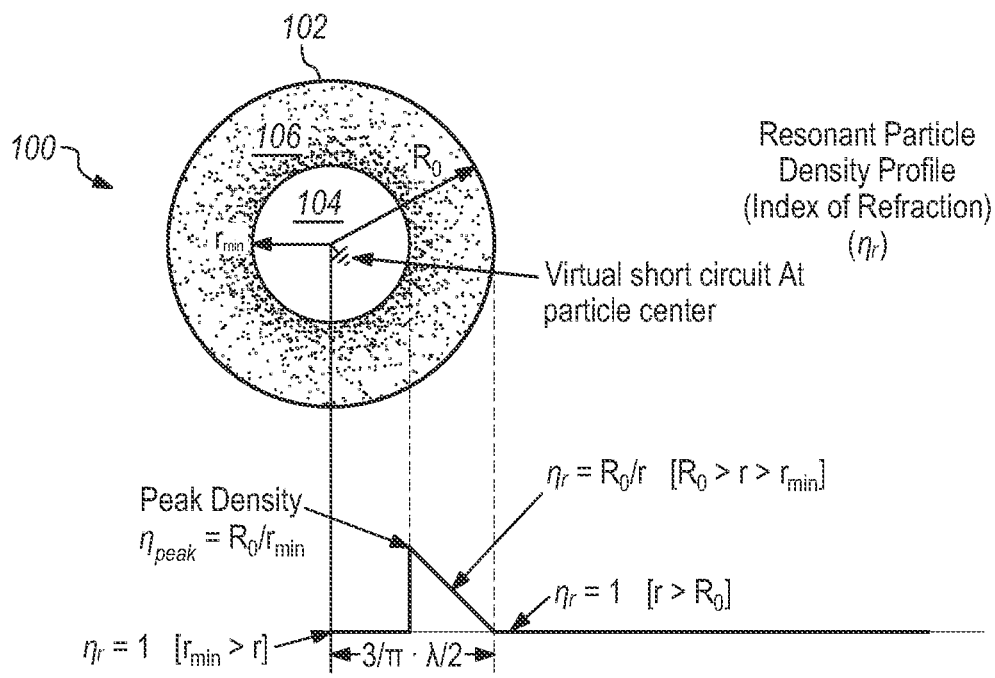
FIG. 1 is a schematic cross-sectional diagram of an EM energy containment device having a structure that approximates a spherically symmetric resonant dielectric in accordance with certain embodiments.

Example embodiments are described herein in the context of spherical dielectric structures for storing electromagnetic energy. The following description is illustrative only and is not intended to be in any way limiting. Other embodiments will readily suggest themselves to those of ordinary skill in the art having the benefit of this disclosure. Reference will be made in detail to implementations of the example embodiments as illustrated in the accompanying drawings. The same reference indicators will be used to the extent possible throughout the drawings and the following description to refer to the same or like items.

In the description of example embodiments that follows, references to "one embodiment", "an embodiment", "an example embodiment", "certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. The term "exemplary" when used herein means "serving as an example, instance or illustration." Any embodiment described herein as "exemplary" is not necessarily to be construed as preferred or advantageous over other embodiments.

In the interest of clarity, not all of the routine features of the implementations described herein are shown and described. It will be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Herein, reference to a computer-readable or machine-readable storage medium encompasses one or more non-transitory, tangible storage media possessing structure. As an example and not by way of limitation, a computer-readable storage medium may include a semiconductor-based circuit or device or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. § 101. Herein, reference to a computer-readable storage medium excludes transitory forms of signal transmission (such as a propagating electrical or electromagnetic signal per se) to the extent that they are not eligible for patent protection under 35 U.S.C. § 101. A computer-readable non-transitory storage medium may be volatile, nonvolatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Devices for containment of electromagnetic energy for a prescribed duration of time are disclosed. Some uses of such devices include energy storage, including quantum computer data storage and refresh, low radio frequency (RF) signature radar beacons and delay lines such as those used in antenna beamforming. Electromagnetic waves can be introduced into the device and extracted from the device in a variety of ways.

FIG. 1 is a cross-sectional diagram of an electromagnetic (EM) energy containment device 100 in accordance with certain embodiments. Device 100 is in the form of a sphere 102 that substantially approximates a spherically symmetric resonant dielectric structure. Alternatively, it can be implemented in other forms, such as graduated spheres, spikes, honeycombs, or combinations thereof, that also approximate a spherically symmetric resonant dielectric structure. In FIG. 1, the device 100 comprises a dielectric material in the form of dielectric sphere 102 with a radius $$R_0 = 3/\pi \cdot \lambda_0/2$$

and an index of refraction profile as shown. $\lambda_0$ represents the wavelength of interest—that is, the resonant wavelength of the EM to be contained in the device 100. Device 100 may comprise a single material or multiple materials. Notably, the device 100 comprises two concentric portions, 102 and 104, at least one of which has a radially-varying index of refraction. It should be noted that this variability may be conveniently achieved by density variation of the material, although other means of variability are contemplated. For convenience, change in density may be interchangeably referred to with change in index of refraction in the foregoing description. The central portion 104 of the sphere 102 has a radius $r_{min}$ and a uniform index of refraction $\eta$ normalized at $\eta_r=1$. In the region 106, the index of refraction increases uniformly starting from the edge of the sphere at $R_0$ to the boundary between the regions 104, 106 at $r_{min}$. The uniformly increasing value is from $\eta_r=1$ at the edge to $\eta_{peak}=R_0/r_{min}$ at the regional boundary $r_{min}$. The uniform rate of increase is defined as $$\eta_r = R_0/r \ (R_0 > r > r_{min})$$

In summary
- $\lambda_0$ is the resonant wavelength of the sphere
- $R_0$ is the outer radius of the sphere. Ideally $R_0 = 3/\pi \cdot \lambda_0/2$
- $\eta_r$ is the radius dependent index of refraction. $\eta_r = R_0/r$, $r > r_{min}$
- $\eta_p$ is the peak index of refraction, and
- $r_{min}$ is the inner radius associated with the peak index of refraction.

Figure 1A:
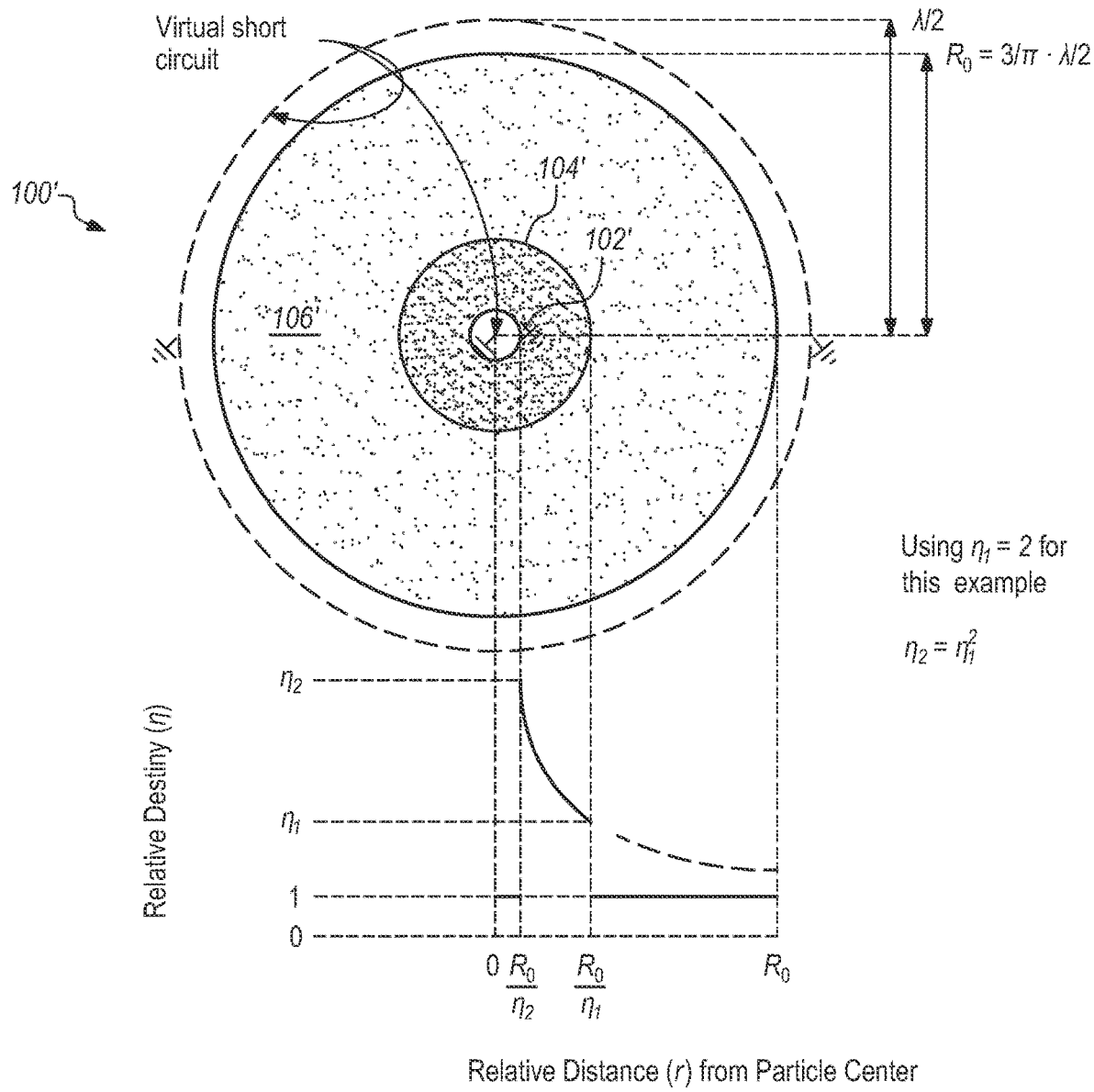
FIG. 1A is a cross-sectional diagram of a related EM energy containment device having a structure that approximates a spherically symmetric resonant dielectric but different dimensional and refraction indices in accordance with certain embodiments.

It will be appreciated that other dimensions, density and index of refraction profiles are contemplated. FIG. 1A is a cross-sectional diagram of an EM energy containment device 100' having such other parameters as indicated. Region 102' extends from the center to radius $r_{min} = R_0/\eta^2$, Region 104' extends from $r_{min}$ to $r_{mid} = R_0/\eta$, Region 106' extends from $r_{mid}$ to $r_{max} = R_0$, The variation in the middle region 104' changes as a function of the power of 2, whereas in the inner region, 102', and the outer region, 106', there is no variability and the index of refraction is 1. A salient feature of the EM energy containment device described herein is that it exhibits an effective index of refraction $\eta_r = R_0/r$ that is equal to the square root of the effective dielectric constant $E_r = R_0^2/r^2$, specifically $E_r = \eta_r^2$.

The EM containment device 100 can be driven in a number of ways with EM energy and "charged up", whereby standing and/or traveling electromagnetic waves are introduced into the device and retained for a controlled period of time. For example, device 100 can be illuminated with external sources, or it can be driven using small (below resonance) internal probes. In either case, up to three independent EM waves, one along each of the sphere's three orthogonal axes, can be applied. Those waves can each have unique frequencies, phases, and amplitudes. The waves can be independently phased to store digital information and the number of states is only limited by the resolution of the receiver.

Figure 2:
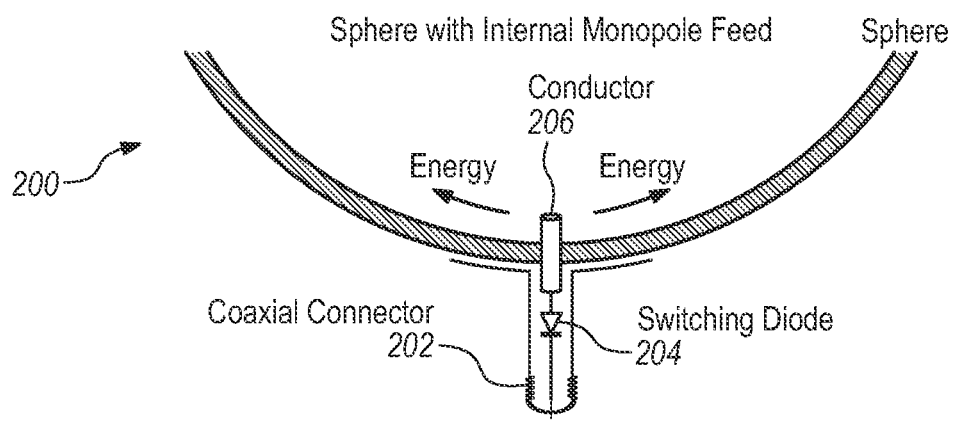
FIG. 2 shows a below resonance monopole-like omnidirectional probe arrangement for driving an EM containment device in accordance with certain embodiments.

FIG. 2 is directed to a below resonance monopole-like omni-directional probe arrangement 200 for driving an EM containment device such as EM containment device 100. A coaxial connector 202 is coupled to a sphere such as sphere 102 (FIG. 1) and introduces an RF signal into the sphere by way of a switching diode 204 coupled to a conductor 206 within the sphere. With reference to the timing diagram of FIG. 2A, at a first time $T_1$, the device 200 is charged up, whereby the RF signal is applied while the switching diode 204 is ON. This may be considered the charge-up phase. At a time $T_2$, the charge-up is completed, with the switching diode being turned OFF, and a selectable delay period $T_2$-$T_3$ is commenced. This may be considered the delay phase. The delay period ends at $T_3$ with switching diode 204 being turned ON and the delayed signal extracted through the coaxial connector 202. This may be considered the extraction phase.

Figure 2A:
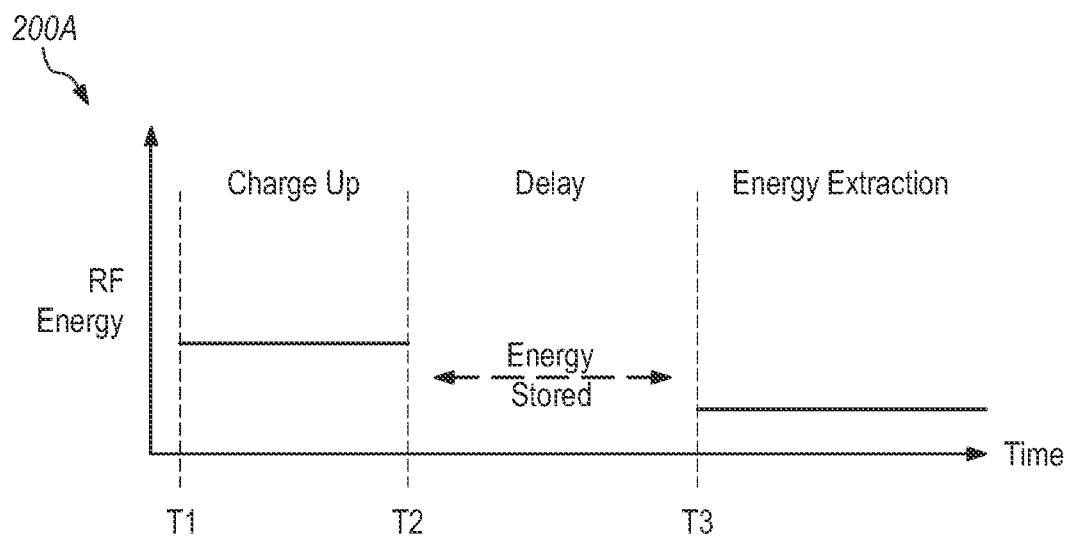
FIG. 2A is a timing diagram showing how interfaces of an EM containment device may be used to charge, hold and extract charge.
Figure 3:
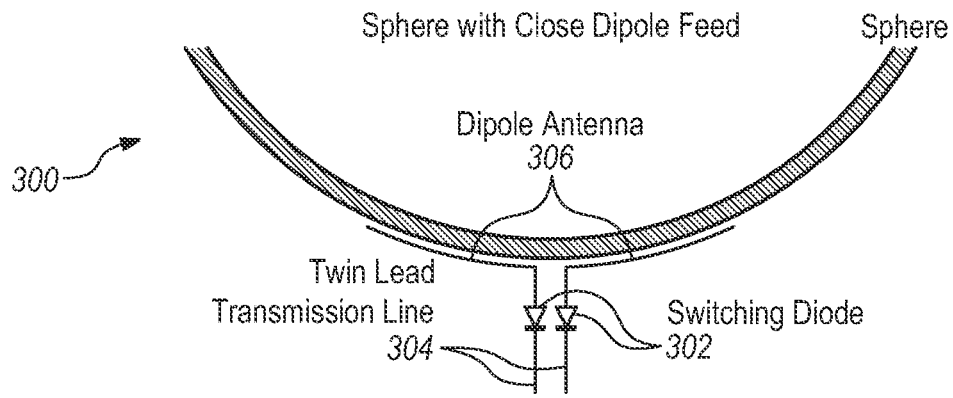
FIG. 3 shows a dipole antenna arrangement in close proximity to an EM containment device for driving that EM containment device in accordance with certain embodiments.

FIG. 3 is directed to a dipole antenna arrangement 300 for driving an EM containment device such as EM containment device 100. In this case, a pair of switching diodes 302 are operated in unison and disposed in a twin lead transmission line 304 coupled to the sphere as shown. The timing is similar to that of the FIG. 2 arrangement and depicted in FIG. 2A. Specifically, at a first time $T_1$, the device is charged up, whereby the RF signal is applied while the switching diodes 302 are ON (charge-up phase). At a time $T_2$, the charge-up is completed, with the switching diodes 302 being turned OFF, and a selectable delay period $T_2$-$T_3$ is commenced (delay phase). The delay period ends at $T_3$ with the switching diodes being turned ON and the delayed signal extracted through the twin lead transmission line 304. Any radiating structure could potentially be substituted.

Figure 4:
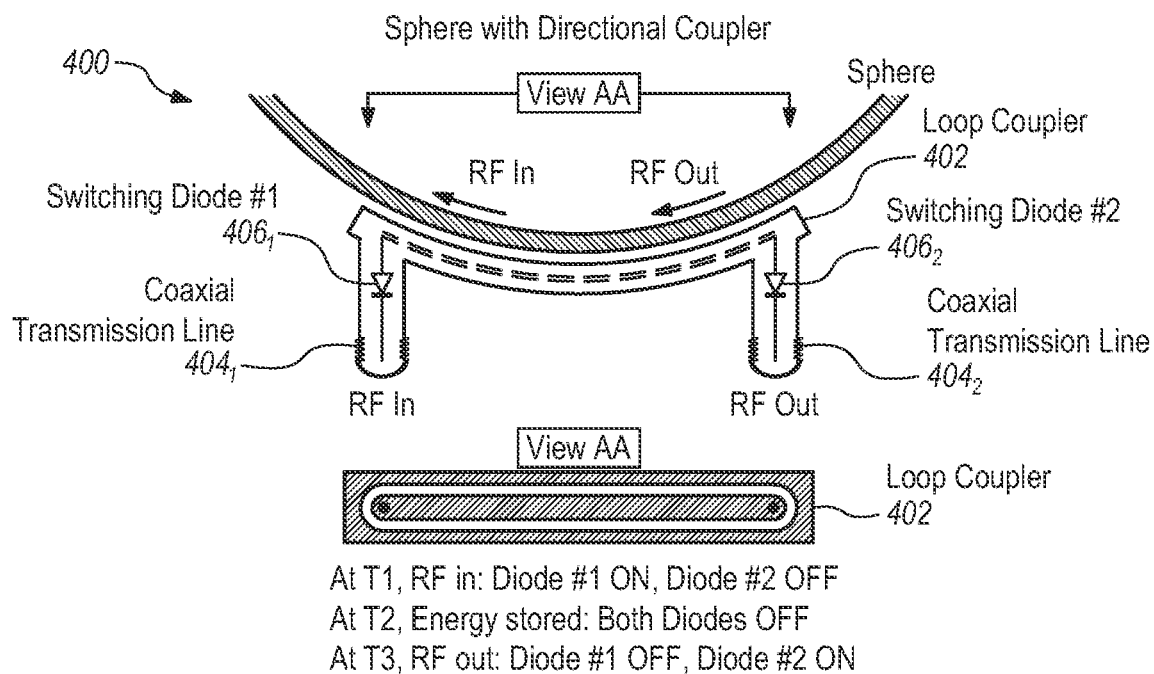
FIG. 4 is a schematic diagram of a directional storage arrangement of an EM containment device, which uses a loop coupler to interface the RF signal with the sphere, in accordance with certain embodiments.

FIG. 4 is a schematic diagram of a directional storage arrangement 400 of an EM containment device such as such as EM containment device 100, which uses a loop coupler 402 to interface the RF signal with the sphere. The input path comprises a first coaxial transmission line $404_1$ with a first switching diode $406_1$, while the output path comprises a second coaxial transmission line $404_2$ with a second switching diode $406_2$. To charge up the device, first switching diode $406_1$ is turned ON, second switching diode $406_2$ is turned OFF, and the RF signal is applied (charge-up phase). The delay is commenced with first switching diode $406_1$ being turned OFF (and second switching diode $406_2$ remaining OFF), for a selected duration (delay phase). The delay period ends with second switching diode $406_2$ being turned ON (and first switching diode $406_1$ remaining OFF) (extraction phase). The timing of this arrangement is as depicted in FIG. 2A.

Figure 5:
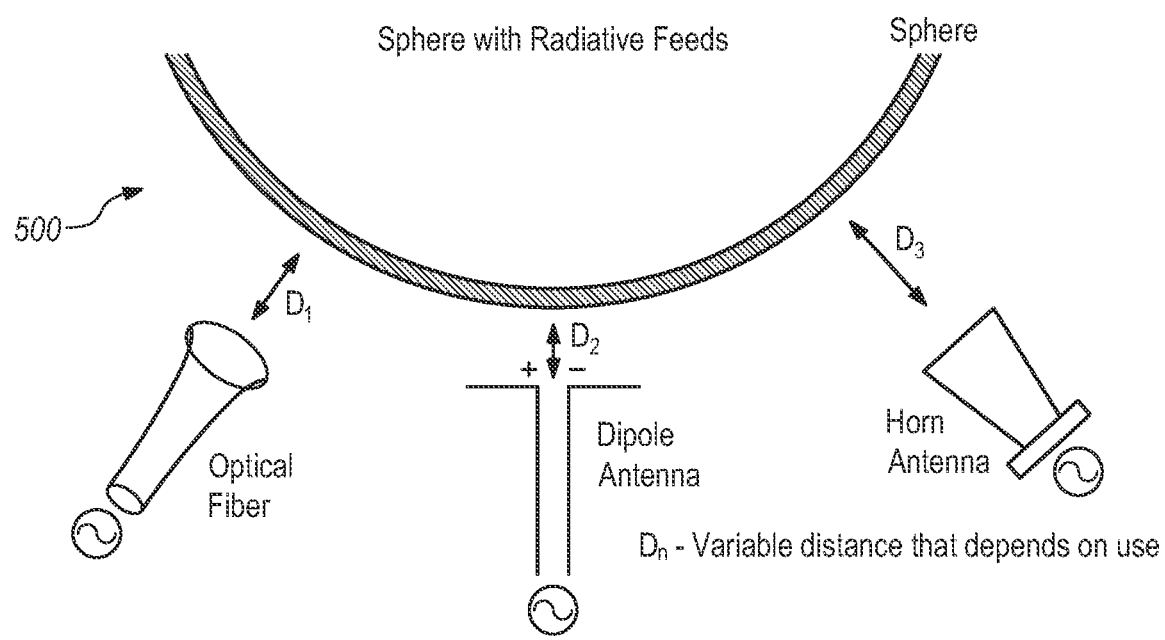
FIG. 5 depicts different radiative-type feeds of an EM containment device and includes an optical arrangement, far-field antenna dipole arrangement and a far-field horn antenna arrangement though any radiating element could be used in accordance with certain embodiments.

FIG. 5 more generally depicts radiative-type feeds of an EM containment device such as such as EM containment device 100, and includes an optical arrangement, antenna dipole arrangement and a horn antenna arrangement as shown. Any radiating structure could potentially be substituted. The coupling distance D in these arrangements will depend on the application, wavelength, and so on, and the timing can be as depicted in FIG. 2A.

As mentioned above, the EM energy containment device in certain embodiments may have a resonant dielectric structure approximating a spherically symmetric resonant dielectric in the form of graduated spheres, spikes, honeycombs, or combinations thereof. The applications (energy storage, etc.) and driving methods (dipole, loop coupler, etc.) would not differ significantly from those described above and may be specific to the particular use.

Figure 6:
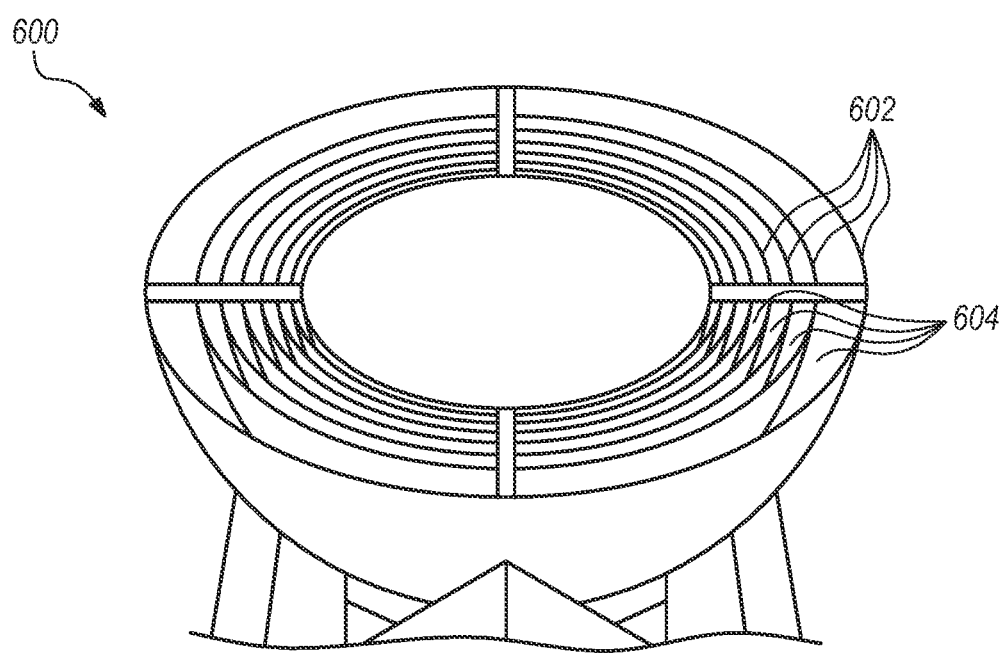
FIG. 6 is a picture of half of a built graduated sphere configuration of an EM energy containment device in accordance with certain embodiments.

FIG. 6 is a cross-sectional view of a graduated sphere configuration of an EM energy containment device in accordance with certain embodiments. Sphere 600 is made of a plurality of concentric spheres of constant dielectric material 602 with variable thicknesses to approximate the index of refraction profile described above, for example with reference to EM energy containment device 100. The spheres 602 may be separated by a different material 604, such as air or another gas, solid, or liquid material, depending on the application and desired behavior. Any of the above applications and driving methods can be used with sphere 600.

Figure 7:
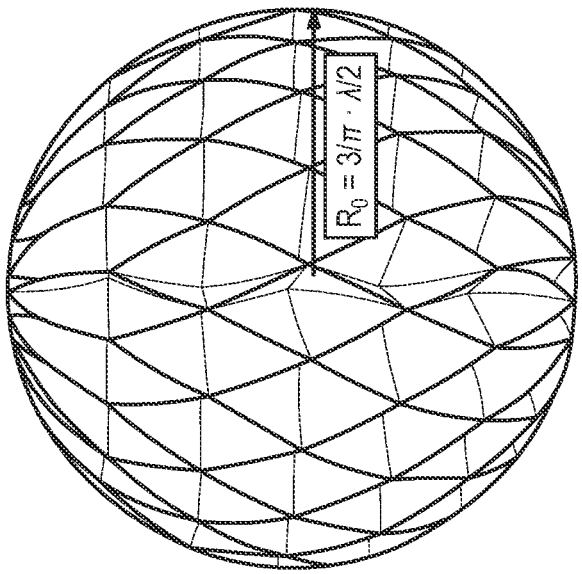
FIGS. 7, 8 and 9 are representative of alternative structures that can be used to approximate the resonant dielectric required for EM energy containment and that can be similarly driven and used in accordance with certain embodiments.
Figure 8:
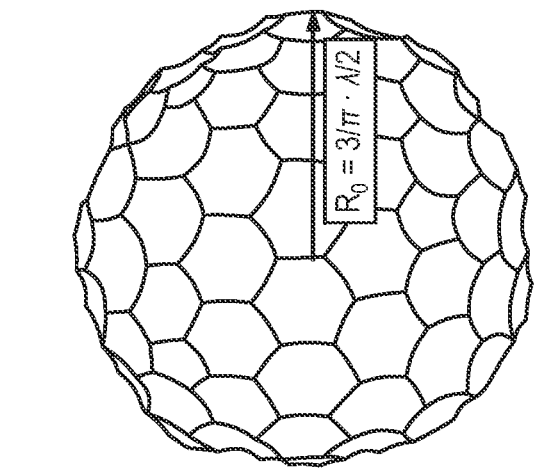
Figure 9:
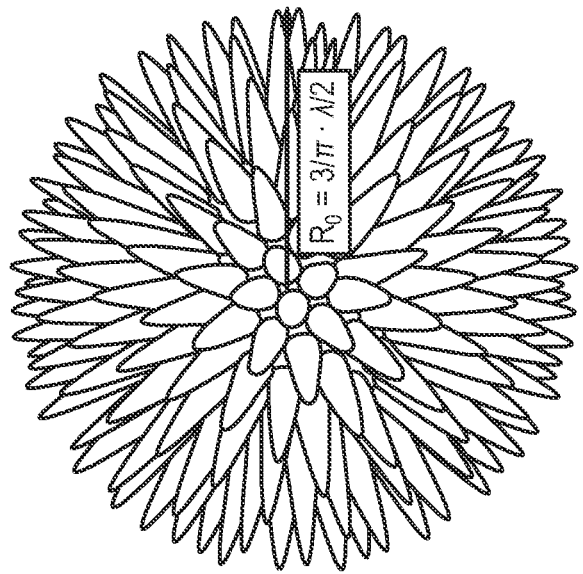

FIGS. 7-9 are alternative spherically symmetric resonant dielectric structures that can be used for EM energy containment and that can be similarly driven and used as described herein. FIGS. 7-8 show different honeycomb type structures, and FIG. 9 shows a spike structure in which dielectric spikes protrude from a hollow thin-walled sphere. All of these structures are dimensioned with $R_0 = 3/\pi \cdot \lambda_0/2$ and can be adapted for operation in the manner described herein. As noted previously, they can store up to three resonant frequencies simultaneously, and can store up to three orthogonal EM waves simultaneously.

Figure 10:
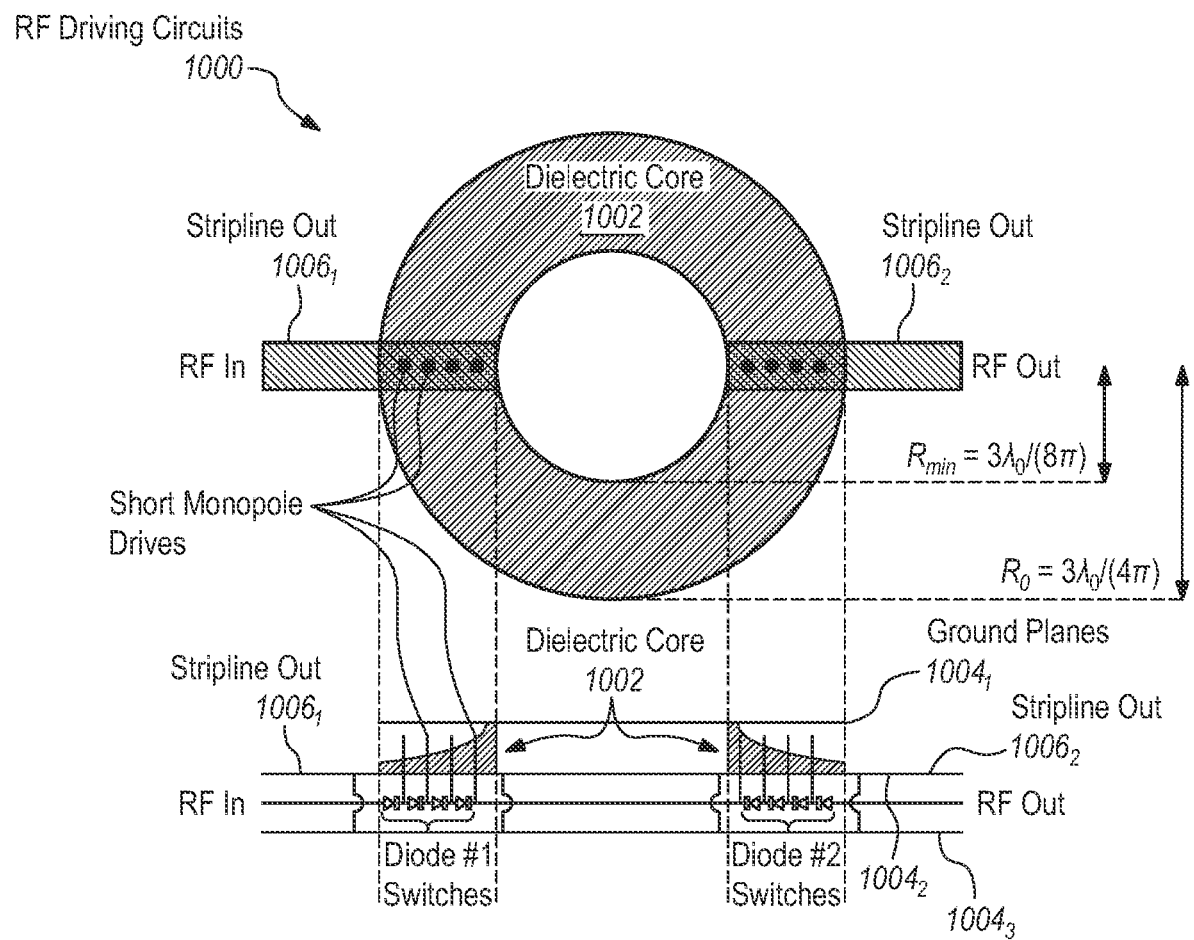
FIG. 10 is a schematic diagrams of a parallel plate delay line application based on similar principles as those of the structure approximating a spherically symmetric dielectric in accordance with certain embodiments.

FIG. 10 are schematic diagrams of a parallel plate delay line application based on similar principles as those of the spherically symmetric resonant dielectric structure described above. The parallel plate delay line structure is easier to manufacture and is smaller than the spherically symmetric resonant dielectric structure and can retain EM waves for longer durations.

In the example the arrangement of FIG. 10, a parallel plate delay device 1000 comprises a dielectric core material 1002 disposed between two ground planes $1004_1$ and $1004_2$. Dielectric core material 1002 has a uniform refraction index, in this example of Er=16, and is annular in shape, with an inner diameter $$R_{min} = \frac{3\lambda_0}{8\pi}$$

and an outer diameter $$R_{outer} = \frac{3\lambda_0}{4\pi}.$$

In cross-section, dielectric core material 1002 is provided with a tapered profile, with for example an Effective Dielectric Strength taper $(R_0/r)^2$, where $R_0 = 3/\pi \cdot \lambda_0/2$, and $\lambda_0$ is the resonant frequency of the device.

The two ground planes $1004_1$ and $1004_2$ and dielectric core material 1002 in the arrangement of FIG. 10 can be easily manufactured and integrated into stripline circuitry. An input side $1006_1$ is configured to receive an RF input signal and an output side $1006_2$ outputs a selectively delayed version of the RF input signal. The selective delay is achieved using a first set of selectively switchable switching diodes $D_1$ and a second set of selectively switchable switching diodes $D_2$. Depending on the timing of the switching of the individual diodes in each of the sets $D_1$ and $D_2$, a signal delay with a selectively controllable duration can be realized. Each of the individual diodes in the two sets $D_1$ and $D_2$ can be individually selected by an appropriate controller (not shown) for fine control of timing. In the example arrangement of FIG. 10, for a given wavelength $\lambda_0$:

Operation can also be at $3\lambda_0/2$, or $3\lambda_0$,

- $R_{outer} = \dfrac{3\lambda_0}{4\pi}$
- $R_{min} = \dfrac{3\lambda_0}{8\pi}$

Dielectric Constant: Er=16

Figure 10A:
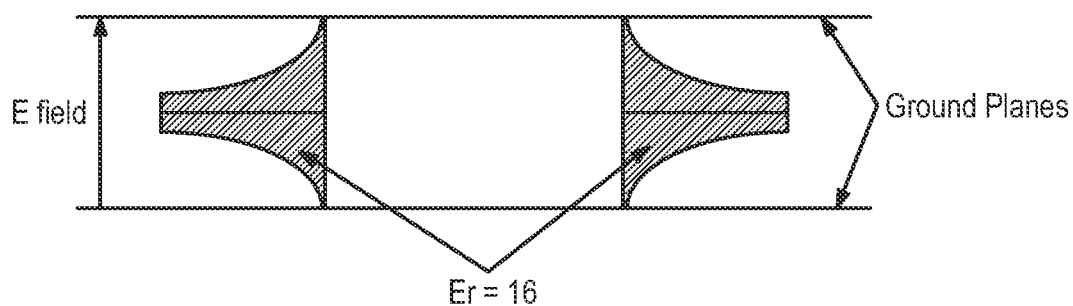
FIGS. 10A-10C are cross-sections of different possible geometries of the dielectric material in the parallel plate delay device in accordance with certain embodiments.
Figure 10B:
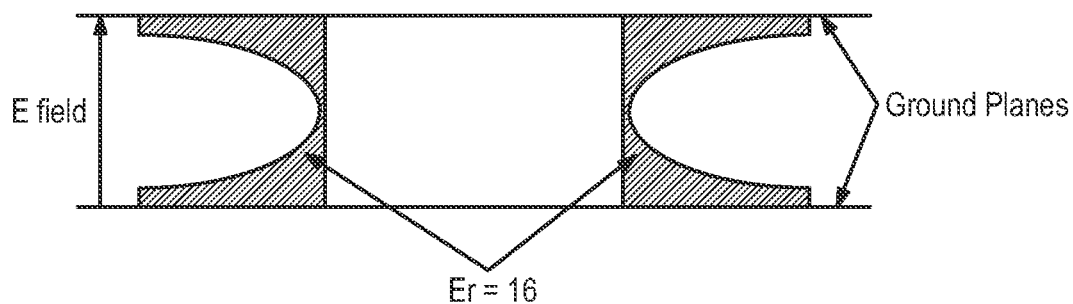
Figure 10C:
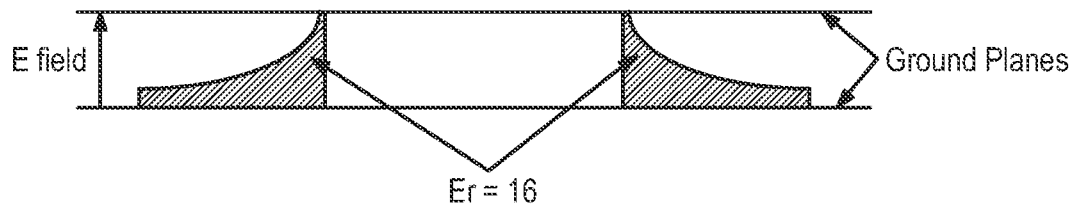

FIGS. 10A-10C are also directed to a parallel plate delay device, but show different possible geometries of the dielectric material in cross-section, with FIG. 10A showing a dual taper arrangement, FIG. 10B a reverse taper arrangement, and FIG. 10C showing the single-taper arrangement described above. The taper geometry is a function of the dielectric constant of the material used. The effective dielectric constant which comprises the solid dielectric and its environment, must be equal to $(R_0/r)^2$ at each radius described in this disclosure.

Figure 11:
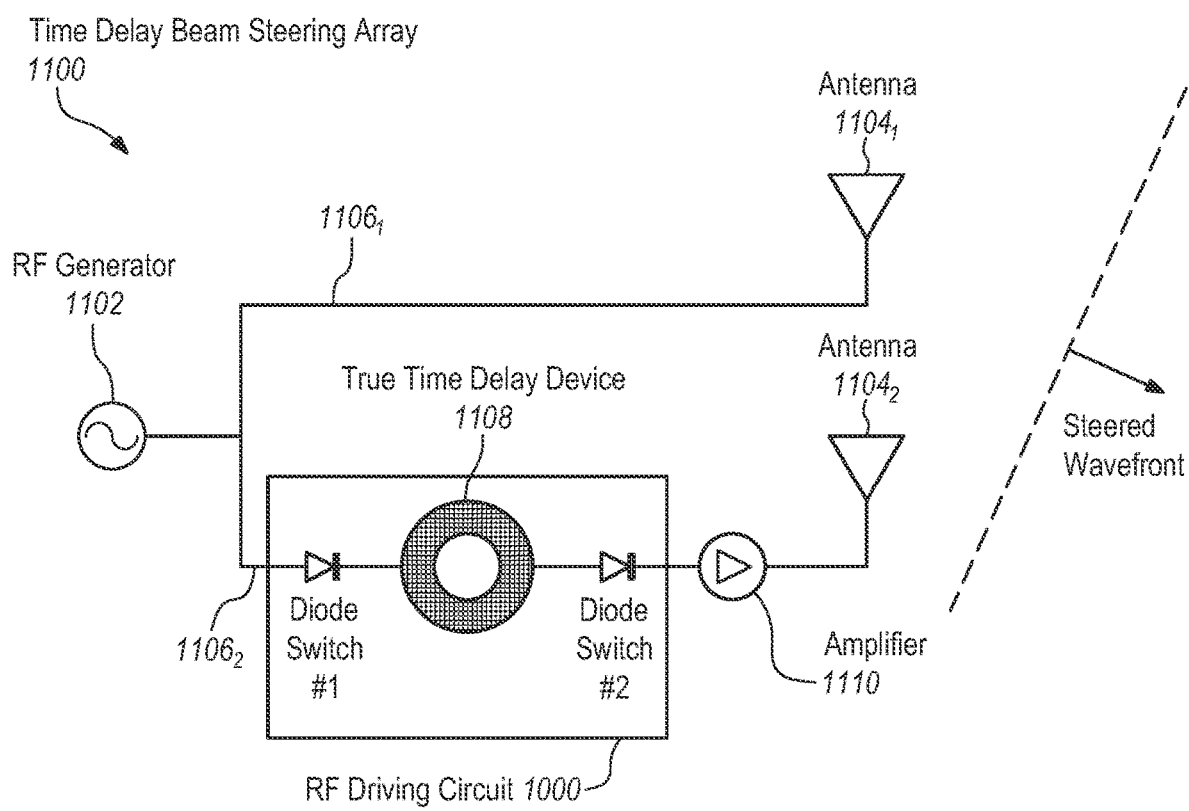
FIG. 11 is a schematic diagram of a delay line application using the parallel plate structure in accordance with certain embodiments.

FIG. 11 is a schematic diagram of a delay line application of a parallel plate resonant dielectric structure such as EM energy containment device 1000 in accordance with certain embodiments. The application is in a beam steering array 1100, in which an RF generator 1102 is operable to generate an RF signal delivered to radiating (or receiving) antennas 1104₁ and 1104₂ along first and second paths 1106₁ and 1106₂, respectively. In signal path 1106₂, a time delay is selectively introduced by operation of Diode Switch 1 and Diode Switch 2 and EM energy containment device 1108, similar to device 100 described above. An amplifier 1110 may also be used in the signal paths, for example 1106₂ as shown, to amplify the respective signal. In the arrangement of FIG. 2, the resultant phase difference between the signals conveyed through the two paths 1106₁ and 1106₂ generates a steerable wave (or sensitivity pattern) as a function of the time delay in the path 1106₂, which time delay can be controlled based on the switching timing of Diode Switches 1 and 2. It should be noted beam steering arrays of this type can utilize any number of antennas 1104ₙ and signal paths 1106ₙ. The term "Diode Switch" is not intended to be limiting as other types of switches generally are envisaged.

Figure 12:
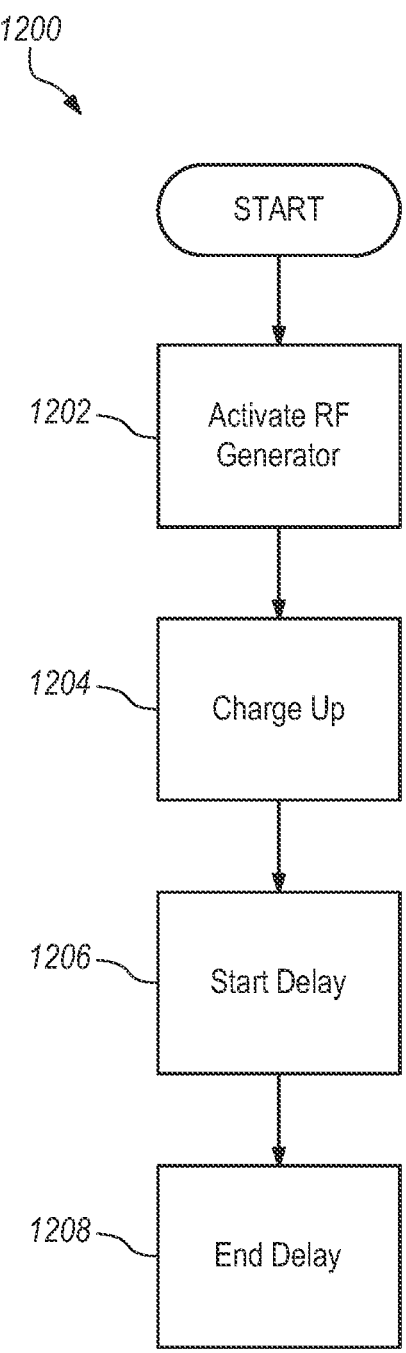
FIG. 12 is flow diagram of a method of operation of the beam steering array in accordance with certain embodiments.

With reference to FIGS. 11 and 12, in certain embodiments, a method of operation of the beam steering array 1100 may include:

Activation of RF generator 1102, at 1202,

Charge up phase at 1204, with Switch 1 ON and Switch 2 is OFF,

Select delay time at 1206, turning Switch 1 OFF and maintaining Switch 1 and Switch 2 OFF for selected delay duration, End delay at 1208 by turning Switch 2 ON.

As mentioned above, this process can be implemented using any number of antennas 1104ₙ and signal paths 1106ₙ. Moreover, depending on the losses of the material deployed in the EM energy containment device 1000 and on manufacturing imperfections, the number of stored wavelengths (and concomitant delay) can be up to about 1000 before about a 30 dB drop is experienced.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted based on the foregoing description. This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. A parallel plate delay device for containing EM energy of wavelength $\lambda_0$ for a selectable duration, comprising:

first and second ground planes; and a dielectric core material disposed between the first and second ground planes and having an axis of radial symmetry normal to the first and second ground planes, the dielectric core material having an annular shape with an inner diameter $$R_{min} = \frac{3\lambda_0}{8\pi}$$

and an outer diameter $$R_{outer} = \frac{3\lambda_0}{4\pi},$$

and having a tapered dielectric constant.

2. The device of claim 1, further comprising a stripline for introducing the EM energy.

3. The device of claim 2, further comprising one or more switches disposed in the stripline.

4. The device of claim 3, wherein the switches are selectably switchable to control a signal delay in the device.

5. The device of claim 1, wherein the dielectric core material has a dual taper cross-section.

6. The device of claim 1, wherein the dielectric core material has a reverse taper cross-section.

7. The device of claim 1, wherein the dielectric core material has a single-taper cross-section.

\* \* \* \* \*